US008841191B2

(12) United States Patent
Hokazono et al.

(10) Patent No.: US 8,841,191 B2
(45) Date of Patent: Sep. 23, 2014

(54) SEMICONDUCTOR DEVICE AND METHOD OF MANUFACTURING SAME

(71) Applicant: Kabushiki Kaisha Toshiba, Tokyo (JP)

(72) Inventors: Akira Hokazono, Kawasaki (JP); Yoshiyuki Kondo, Yokohama (JP); Toshitaka Miyata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/766,566

(22) Filed: Feb. 13, 2013

(65) Prior Publication Data
US 2014/0054657 A1 Feb. 27, 2014

(30) Foreign Application Priority Data
Aug. 23, 2012 (JP) .................. 2012-184474

(51) Int. Cl.
*H01L 21/336* (2006.01)
*H01L 29/78* (2006.01)
*H01L 29/66* (2006.01)
*H01L 29/08* (2006.01)
*H01L 29/10* (2006.01)
*H01L 29/739* (2006.01)

(52) U.S. Cl.
CPC .......... *H01L 29/78* (2013.01); *H01L 29/66477* (2013.01); *H01L 29/66356* (2013.01); *H01L 29/0843* (2013.01); *H01L 29/1025* (2013.01); *H01L 29/7391* (2013.01)
USPC ............................ 438/289; 438/286; 257/408

(58) Field of Classification Search
CPC .................. H01L 29/7391; H01L 29/7393
USPC ........... 438/289, 290, 286; 257/408, 349, 376
See application file for complete search history.

(56) References Cited

U.S. PATENT DOCUMENTS 6,310,798 B1 10/2001 Morimoto
2006/0270168 A1* 11/2006 Tan et al. .................. 438/289
(Continued)

FOREIGN PATENT DOCUMENTS

JP 04-370977 A 12/1992
JP 05-190847 A 7/1993
(Continued)

OTHER PUBLICATIONS

Anupama Bowonder, et al., "Low-Voltage Green Transistor Using Ultra Shallow Junction and Hetero-Tunneling," IWJP 2008.
(Continued)

*Primary Examiner* — Caridad Everhart
(74) *Attorney, Agent, or Firm* — Knobbe, Martens, Olson & Bear LLP

(57) ABSTRACT

In one embodiment, a semiconductor device includes a substrate, a gate insulator on the substrate, and a gate electrode on the gate insulator. The device further includes a source diffusion layer of a first conductivity type and a drain diffusion layer of a second conductivity type disposed on a surface of the substrate so as to sandwich the gate electrode. The device further includes a junction forming region disposed between the source diffusion layer and the drain diffusion layer so as to contact the source diffusion layer. The junction forming region includes a source extension layer of the first conductivity type, a pocket layer of the second conductivity type above the source extension layer, and a diffusion suppressing layer disposed between the source extension layer and the pocket layer and containing carbon so as to suppress diffusion of impurities between the source extension layer and the pocket layer.

20 Claims, 14 Drawing Sheets

(56) References Cited

U.S. PATENT DOCUMENTS

| | | | |
|---|---|---|---|
| 2009/0057784 A1* | 3/2009 | Chen | 257/408 |
| 2011/0147838 A1* | 6/2011 | Gossner et al. | 257/345 |
| 2012/0049201 A1* | 3/2012 | Yamaguchi et al. | 257/77 |
| 2013/0075830 A1* | 3/2013 | Miyano et al. | 257/408 |

FOREIGN PATENT DOCUMENTS

| | | |
|---|---|---|
| JP | 09-260692 A | 10/1997 |
| JP | 2001-068632 A | 3/2001 |
| JP | 2001-102608 A | 4/2001 |

OTHER PUBLICATIONS

A. Hokazono, et al., Steep Channel & Halo Profiles utilizing Boron-Diffusion-Barrier Layers (Si:C) for 32 nm Node and Beyond, Symposium on VLSI Technology Digest of Technical Papers, 2008, pp. 112-113.

A. Hokazono, et al., "Steep Channel Profiles in n/pMOS Controlled by Boron-doped Si:C Layers for Continual Bulk-CMOS Sealing," IEDM Tech. Dig. 2009, pp. 637-676.

Ram Asra, et al., "A Tunnel FET for $V_{DD}$ Scaling Below 0.6 V With a CMOS-Comparable Performance," IWJT 2008.

* cited by examiner

SEMICONDUCTOR DEVICE AND METHOD OF MANUFACTURING SAME

CROSS REFERENCE TO RELATED APPLICATION

This application is based upon and claims the benefit of priority from the prior Japanese Patent Application No. 2012-184474, filed on Aug. 23, 2012, the entire contents of which are incorporated herein by reference.

FIELD

Embodiments described herein relate to a semiconductor device and a method of manufacturing the same.

BACKGROUND

To reduce power consumption of a semiconductor device, a tunnel FET (TFET) is attracting attention for its high controllability of current at small gate voltage (its small sub-threshold coefficient). For example, a conventional TFET includes, between a source diffusion layer of a first conductivity type and a drain diffusion layer of a second conductivity type, a impurity semiconductor layer of the second conductivity type called pocket layer (or pocket region) to contact the source diffusion layer, and includes a p-n junction plane serving as a tunnel junction plane between the source diffusion layer and the pocket layer. Examples of such TFET include a horizontal TFET in which the pocket layer is in contact with a side surface of the source diffusion layer, and a vertical TFET in which the pocket layer is formed between an upper surface of the source diffusion layer and a lower surface of a gate insulator. The vertical TFET has an advantage that its sub-threshold coefficient is smaller than that of the horizontal TFET, but has a disadvantage that the tunnel junction plane having an abrupt change in impurity concentration is difficult to form by ion implantation. Moreover, although epitaxial growth can be used to form the tunnel junction plane of the vertical TFET to exhibit an abrupt change in impurity concentration, the abruptness would be lost because impurities in the source diffusion layer and the pocket layer are diffused in a subsequent heating process.

DETAILED DESCRIPTION

Embodiments will now be explained with reference to the accompanying drawings.

In one embodiment, a semiconductor device includes a substrate, a gate insulator disposed on the substrate, and a gate electrode disposed on the gate insulator. The device further includes a source diffusion layer of a first conductivity type and a drain diffusion layer of a second conductivity type which are disposed on a surface of the substrate so as to sandwich the gate electrode, the second conductivity type being an opposite conductivity type to the first conductivity type. The device further includes a junction forming region disposed between the source diffusion layer and the drain diffusion layer so as to contact the source diffusion layer. The junction forming region includes a source extension layer of the first conductivity type, a pocket layer of the second conductivity type disposed above the source extension layer, and a diffusion suppressing layer disposed between the source extension layer and the pocket layer and containing carbon so as to suppress diffusion of impurities between the source extension layer and the pocket layer.

First Embodiment

1) Structure of Semiconductor Device of First Embodiment

Figure 1:
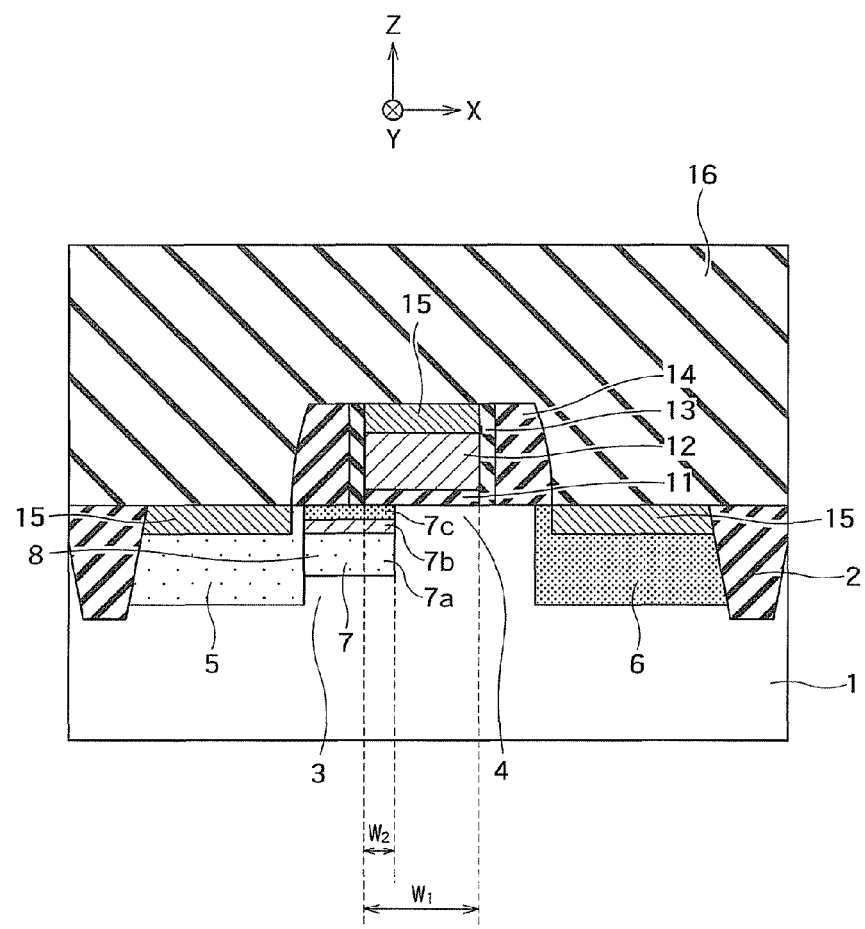
FIG. 1 is a cross sectional view showing a structure of a semiconductor device of a first embodiment.

FIG. 1 is a cross sectional view showing a structure of a semiconductor device of a first embodiment.

The semiconductor device of FIG. 1 includes, as components of a tunnel FET (TFET), a substrate 1, isolation insulators 2, a well region 3, a channel region 4, a heavily doped source diffusion layer 5, a drain diffusion layer 6, a tunnel junction forming region 7, a gate insulator 11, a gate electrode 12, first sidewall insulators 13, second sidewall insulators 14, silicide layers 15, and an inter layer dielectric 16. The heavily doped source diffusion layer 5 and the tunnel junction forming region 7 are examples of a source diffusion layer and a junction forming region of the disclosure, respectively.

The substrate 1 is a semiconductor substrate such as a silicon substrate, for example. The substrate 1 may be either a p-type substrate or an n-type substrate. FIG. 1 shows a direction X and a direction Y which are parallel to a surface of the substrate 1 and perpendicular to each other, and a direction Z which is perpendicular to the surface of the substrate 1. The directions X and Y correspond to a gate-length direction and a channel-width direction of the TFET, respectively. The substrate 1 includes the well region 3 and the channel region 4. The gate structure of the TFET is formed on the channel region 4. If the TFET is an n-type TFET, the well region 3 is formed as a p-type region, whereas if the TFET is a p-type TFET, the well region 3 is formed as an n-type region.

The isolation insulators 2 are embedded in isolation trenches formed on the surface of the substrate 1. The isolation insulators 2 are silicon oxide films, for example. A depth of the isolation trenches is 200 to 300 nm, for example.

The gate insulator 11 is formed on the substrate 1. The gate insulator 11 is a silicon oxide film, for example. A thickness of the gate insulator 11 is 0.5 to 6.0 nm, for example.

The gate electrode 12 is formed on the gate insulator 11. The gate electrode 12 is a polysilicon layer, for example. A thickness of the gate electrode 12 is 50 to 200 nm, for example.

The first sidewall insulators (offset spacers) 13 are formed on side surfaces of the gate electrode 12. The first sidewall insulators 13 are silicon nitride films, for example. A thickness of the first sidewall insulators 13 is 3.0 to 12.0 nm, for example.

The second sidewall insulators 14 are formed on the side surfaces of the gate electrode 12 via the first sidewall insulators 13. The second sidewall insulators 14 are silicon oxide films, for example.

The source diffusion layer 5 and the drain diffusion layer 6 are formed on the surface of the substrate 1 so as to sandwich the gate electrode 12. The source diffusion layer 5 has a first conductivity type, and the drain diffusion layer 6 has a second conductivity type which is an opposite conductivity type to the first conductivity type. For example, when the TFET is an n-type TFET, the source diffusion layer 5 is a p-type diffusion layer and the drain diffusion layer 6 is an n-type diffusion layer. On the contrary, when the TFET is a p-type TFET, the source diffusion layer 5 is an n-type diffusion layer and the drain diffusion layer 6 is a p-type diffusion layer. In these cases, p-type impurities contained in the p-type diffusion layer are boron (B) for example, and n-type impurities contained in the n-type diffusion layer are arsenic (As) for example.

The silicide layers 15 are formed on surfaces of the source diffusion layer 5, the drain diffusion layer 6, and the gate electrode 12. The silicide layers 15 are nickel silicide layers, for example.

The inter layer dielectric 16 is formed on the substrate 1 so as to cover the TFET. The inter layer dielectric 16 is a silicon oxide film, for example.

The junction forming region 7 is formed between the source diffusion layer 5 and the drain diffusion layer 6 so as to contact the source diffusion layer 5 and so as to be separated from the drain region 6. As shown in FIG. 1, the junction forming region 7 includes a source extension layer 7a of the first conductivity type, a diffusion suppressing layer 7b, and a surface pocket layer 7c of the second conductivity type. The surface pocket layer 7c is an example of a pocket layer of the disclosure. The junction forming region 7 of the present embodiment is formed by sequentially forming, in a trench 8 on the surface of the substrate 1, the source extension layer 7a, the diffusion suppressing layer 7b, and the surface pocket layer 7c by epitaxial growth. The shape of the trench 8 will be described later in detail.

The source extension layer 7a is a semiconductor layer having the first conductivity type as same as the source diffusion layer 5. When the TFET is an n-type TFET, the source extension layer 7a is a silicon layer doped with boron, for example. On the contrary, when the TFET is a p-type TFET, the source extension layer 7a is a silicon layer doped with phosphorus (P), for example. A thickness of the source extension layer 7a is 40 nm, for example. The source extension layer 7a of the present embodiment is in contact with the source diffusion layer 5, and functions as a portion of the source diffusion layer 5.

The pocket layer 7c, which is formed above the source extension layer 7a, is a semiconductor layer having the second conductivity type which is an opposite conductivity type to the source diffusion layer 5. When the TFET is an n-type TFET, the pocket layer 7c is a silicon layer doped with phosphorus, for example. On the contrary, when the TFET is a p-type TFET, the pocket layer 7c is a silicon layer doped with boron, for example. The pocket layer 7c has a thickness of 10 nm, for example. In the present embodiment, the source extension layer 7a faces the pocket layer 7c via the diffusion suppressing layer 7b, so that a tunnel current flows between the source extension layer 7a and the pocket layer 7c.

The diffusion suppressing layer 7b is a semiconductor layer formed between the source extension layer 7a and the pocket layer 7c. A thickness of the diffusion suppressing layer 7b is 5 nm, for example. The diffusion suppressing layer 7b is, for example, an Si:C layer containing silicon and carbon. As a result of strenuous examination by inventors of the present invention, it was found that C atoms in the Si:C layer act to suppress diffusion of boron and phosphorus. Therefore, if such a diffusion suppressing layer 7b is formed between the source extension layer 7a and the pocket layer 7c, diffusion of impurities (such as boron and phosphorus) between the source extension layer 7a and the pocket layer 7c can be suppressed.

Accordingly, the junction forming region 7 in the present embodiment is formed by epitaxial growth so that a change in impurity concentration becomes abrupt between the source extension layer 7a and the pocket layer 7c. Furthermore, the diffusion suppressing layer 7b is formed between the source extension layer 7a and the pocket layer 7c in the present embodiment. Consequently, it is possible in the present embodiment to suppress diffusion of impurities between the source extension layer 7a and the pocket layer 7c in a subsequent heating process, so that the abruptness of the change in impurity concentration can be maintained. Therefore, according to the present embodiment, it is possible to enhance device properties of the TFET and to suppress process variation due to the heating process.

Hereinafter, more detailed description will be given of the junction forming region 7 and the diffusion suppressing layer 7b.

In the present embodiment, a composition ratio of Si atoms and C atoms in the diffusion suppressing layer 7b is set to 1-X:X where "X" is set to $3.0\times10^{-3}$ to $3.0\times10^{-2}$. More specifically, in the present embodiment, a ratio of the C atoms to the total number of the Si atoms and the C atoms in the diffusion suppressing layer 7b is set to 0.3 to 3.0 Atomic %. This is because if the ratio of the C atoms is too small, the action to suppress diffusion of impurities by the diffusion suppressing layer 7b is degraded, whereas if the ratio of the C atoms is too large, defects may be generated in the diffusion suppressing layer 7b. The ratio of the C atoms may be set to values other than 0.3 to 3.0 Atomic %.

The diffusion suppressing layer 7b of the present embodiment may be an SiGe:C layer containing silicon, germanium and carbon. By adding germanium to the diffusion suppressing layer 7b, it is possible to enhance a tunnel probability on the side of the source diffusion layer 5. In this case, the ratio of the Ge atoms to the total number of the Si atoms and the Ge atoms in the diffusion suppressing layer 7b is set to 5.0 Atomic % or more, for example. As the ratio of the Ge atoms increases, a bandgap between a conduction band and a valence band becomes narrower, so that a flow of a tunnel current is promoted. The diffusion suppressing layer 7b of the present embodiment may also be a Ge:C layer containing germanium and carbon.

Reference sign "$W_1$" denotes an X-directional width of a lower surface of the gate electrode 12. Reference sign "$W_2$" denotes an X-directional width of a region in which an upper surface of the junction forming region 7 faces the lower surface of the gate electrode 12. Although the width "$W_2$" is set narrow and is set less than half the width "$W_1$" ($W_2 < W_1/2$) in the present embodiment, the width "$W_2$" may be expanded to half the width "$W_1$" or more ($W_2 \geq W_1/2$). The latter structure will be described in detail in a later-described third embodiment.

2) Method of Manufacturing Semiconductor Device of First Embodiment

FIGS. 2A to 4C are cross sectional views showing a method of manufacturing the semiconductor device of the first embodiment.

Figure 2A:
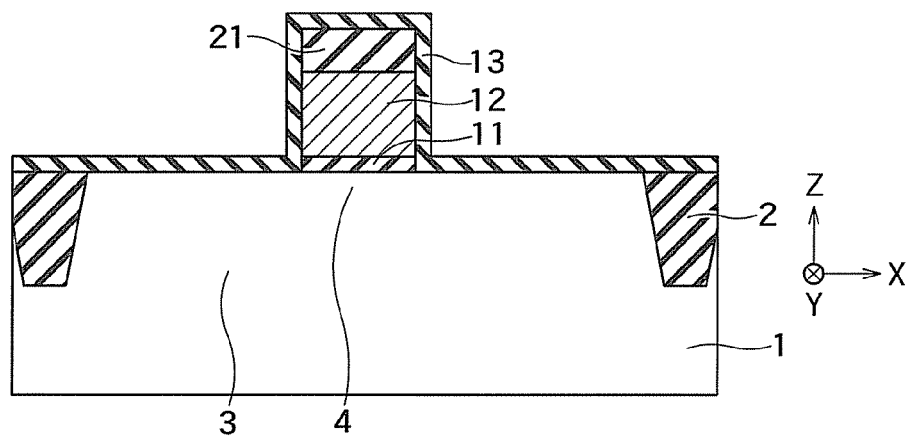
FIGS. 2A to 4C are cross sectional views showing a method of manufacturing the semiconductor device of the first embodiment.

First, as shown in FIG. 2A, the isolation insulators 2 are formed on the surface of the substrate 1 by shallow trench isolation (STI) method. An unshown insulating layer is then formed on a surface of a device region of the substrate 1. The insulating layer is a silicon oxide film with a thickness of 10 nm or less, for example.

Next, ion implantation and activation rapid thermal anneal (RTA) are performed to form the well region 3 and the channel region 4 (see FIG. 2A) in the substrate 1. In this case, when the TFET is an n-type TFET, the well region 3 is formed, for example, with use of boron under ion-implantation conditions of 260 keV and $2.0 \times 10^{13}$ cm$^{-2}$, and the channel region 4 is formed, for example, with use of arsenic under ion-implantation conditions of 80 keV and $1.0 \times 10^{13}$ cm$^{-2}$. On the contrary, when the TFET is a p-type TFET, the well region 3 is formed, for example, with use of phosphorus under ion-implantation conditions of 500 keV and $3.0 \times 10^{13}$ cm$^{-2}$, and the channel region 4 is formed, for example, with use of boron under ion-implantation conditions of 10 keV and $1.5 \times 10^{13}$ cm$^{-2}$. The ion implantation for forming the channel region 4 can be used to adjust the threshold voltage in a boundary region between the source extension layer 7a and the pocket layer 7c.

Next, an insulating material for forming the gate insulator 11 is formed on the substrate 1 by thermal oxidation or low pressure chemical vapor deposition (LPCVD) (FIG. 2A). An electrode material for forming the gate electrode 12 is then deposited on the insulating material. Pre-doping is then applied to the electrode material (FIG. 2A). A cap insulator 21 is then deposited on the electrode material (FIG. 2A). The cap insulator 21 is a silicon nitride film, for example.

Next, a resist mask for gate processing is formed by optical lithography, X-ray lithography, or electron beam lithography, and then the cap insulator 21 and the electrode material are etched by reactive ion etching (RIE). As a result, the gate electrode 12 is formed on the substrate 1 via the gate insulator 11 (FIG. 2A).

Examples of the gate insulator 11 include, in addition to the SiO$_2$ film, a SiN film, a SiON film, and a high-k insulating film (such as HfSiON film). Examples of the gate electrode 12 include a metal layer in addition to the polysilicon layer.

Next, an unshown post-oxidation SiO$_2$ film with a thickness of 1.0 to 2.0 nm is formed on the surfaces of the substrate 1 and the gate electrode 12 by thermal oxidation. As shown in FIG. 2A, an insulating material for forming the first sidewall insulators 13 (hereinafter, referred to as an insulating material 13) is then formed on the entire surface of the substrate 1 by LPCVD. A thickness of the insulating material 13 is 3.0 to 12.0 nm, for example.

Figure 2B:
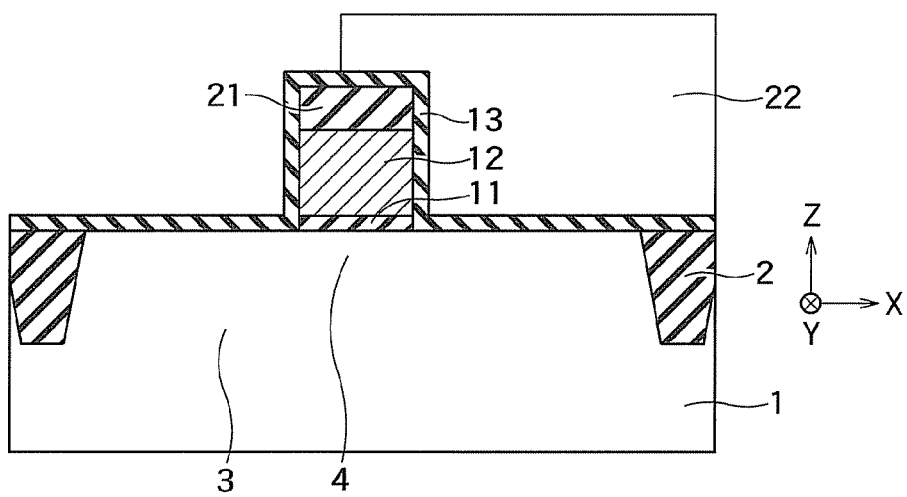
Figure 2C:
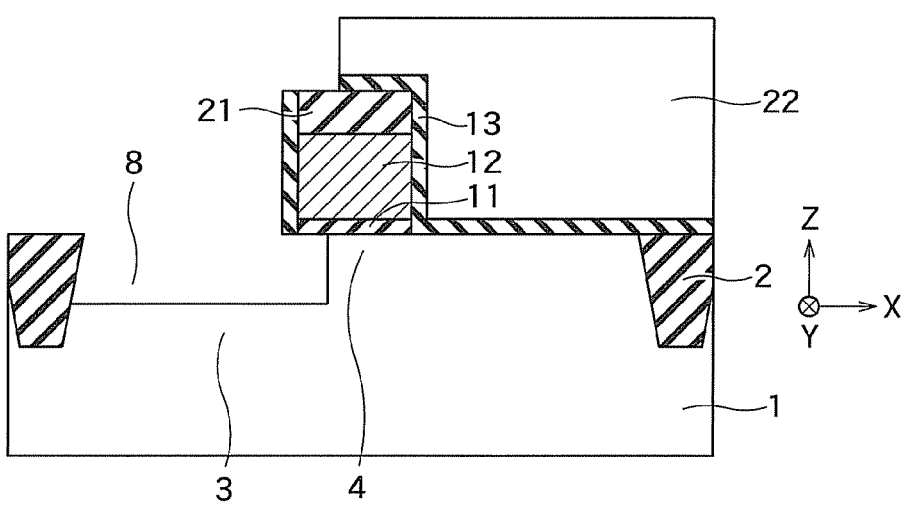

Next, as shown in FIG. 2B, the drain side of the substrate 1 is coated with a resist film 22. As shown in FIG. 2C, etching is then performed using the resist film 22 as a mask to remove the insulating material 13 on the upper surfaces of the substrate 1 and the cap insulator 21 on the source side and to form the trench 8 on the surface of the substrate 1.

In the present embodiment, the trench 8 is formed by isotropic etching. Accordingly, the trench 8 is formed so as to extend not only between the isolation insulator 2 and the gate electrode 12 but also extend under the gate electrode 12. An etching amount in a longitudinal direction at the time of forming the trench 8 determines a length of the width "W$_2$" of FIG. 1. In a step of FIG. 2C, a region in which the junction forming region 7 is to be formed is formed by the trench 8. The resist film 22 is then removed.

Figure 3A:
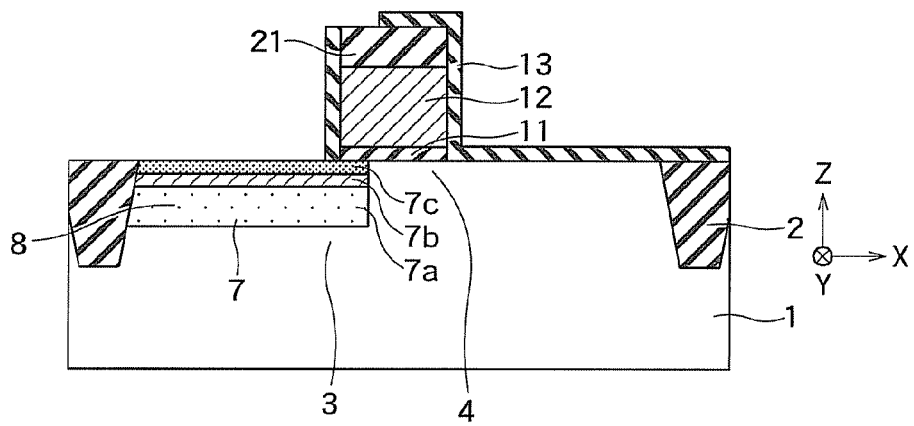

Next, as shown in FIG. 3A, the source extension layer 7a, the diffusion suppressing layer 7b, and the pocket layer 7c are sequentially formed in the trench 8 by epitaxial growth. As a result, the junction forming region 7 is formed in the trench 8. One of the source extension layer 7a and the pocket layer 7c is a silicon layer doped with boron, for example. The other is a silicon layer doped with phosphorus, for example. The diffusion suppressing layer 7b is an Si:C layer, for example.

For example, the junction forming region 7 is formed by removing a silicon oxide film on the surface of the trench 8 with diluted fluoric acid, and then successively forming the source extension layer 7a, the diffusion suppressing layer 7b, and the pocket layer 7c by epitaxial growth with use of an LPCVD apparatus.

The silicon layer doped with boron is formed, for example, by heating the substrate 1 and the like in hydrogen atmosphere under high temperature of 800° C. or more, and supplying reactant gas such as SiH$_4$, SiH$_2$Cl$_2$, SiHCl$_3$, HCl, and B$_2$H$_6$ onto the substrate 1 with hydrogen. The silicon layer doped with phosphorus may be formed, for example, by performing the same processing with use of PH$_3$ instead of B$_2$H$_6$. The Si:C layer is formed, for example, by heating the substrate 1 and the like in hydrogen atmosphere under high temperature of 700° C. or more and supplying reactant gas such as SiH$_4$, SiH$_2$Cl$_2$, SiHCl$_3$, HCl, and SiH$_3$CH$_3$ onto the substrate 1 with hydrogen.

The substrate 1 is preferred to have a structure that when the trench 8 is formed on the surface of the substrate 1, a bottom surface of the trench 8 becomes a (100) plane and a side surface of the trench 8 becomes a (110) plane. This makes it possible to selectively form epitaxial semiconductor layers (source extension layer 7a, diffusion suppressing layer 7b, and pocket layer 7c) on the bottom surface of the trench 8.

Moreover, a height of the upper surface of the pocket layer 7c in the present embodiment coincides with a height of the upper surface of the substrate 1. However, the height of the upper surface of the pocket layer 7c may be higher than the upper surface of the substrate 1.

Figure 3B:
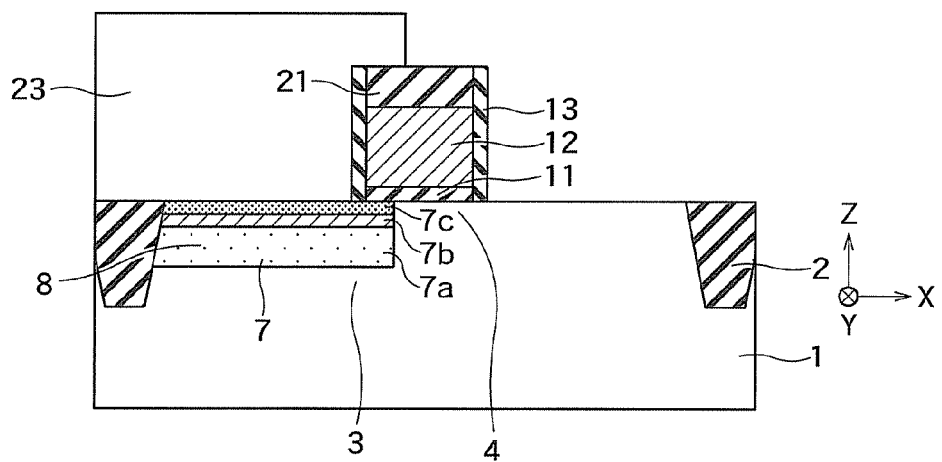

Next, as shown in FIG. 3B, the source side of the substrate 1 is coated with a resist film 23. As shown in FIG. 3B, etching is then performed using the resist film 23 as a mask to remove the insulating material 13 on the upper surfaces of the substrate 1 and the cap insulator 21 on the drain side. As a result, the first sidewall insulators 13 are formed on the side surfaces of the gate electrode 12 and the cap insulator 21. The resist film 23 is then removed.

Figure 3C:
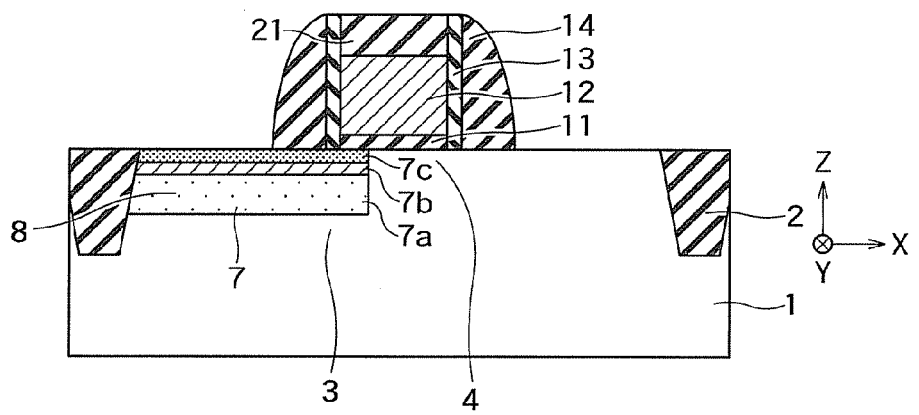

Next, as shown in FIG. 3C, the second sidewall insulators 14 are formed on the side surfaces of the gate electrode 12 and the cap insulator 21 via the first sidewall insulators 13. The second sidewall insulators 14 are formed, for example, by depositing an insulating material for forming the second sidewall insulators 14 on the entire surface of the substrate 1 and etching the insulating material by RIE.

Figure 4A:
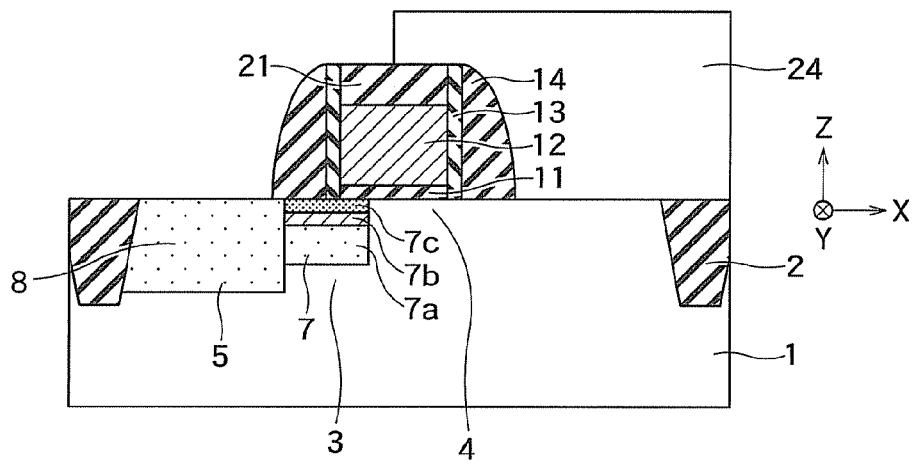

Next, as shown in FIG. 4A, the drain side of the substrate 1 is coated with a resist film 24. As shown in FIG. 4A, by ion implantation using the resist film 24 as a mask, a heavily doped impurity region to be the source diffusion layer 5 is then formed in a region in which the source diffusion layer 5 is to be formed on the surface of the substrate 1.

In this case, when the TFET is an n-type TFET, boron is implanted under ion-implantation conditions of 2.0 to 5.0 keV and 1.0 to $4.0 \times 10^{15}$ cm$^{-2}$, for example. On the contrary, when the TFET is a p-type TFET, arsenic is implanted under ion-implantation conditions of 15 to 30 keV and 1.0 to $4.0 \times 10^{15}$ cm$^{-2}$, for example. The resist film 24 is then removed.

Figure 4B:
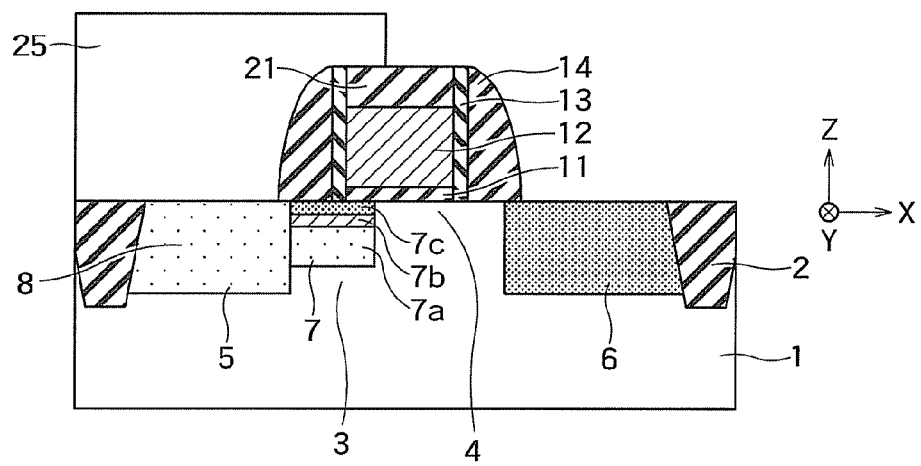

Next, as shown in FIG. 4B, the source side of the substrate 1 is coated with a resist film 25. As shown in FIG. 4B, by ion implantation using the resist film 25 as a mask, a heavily doped impurity region to be the drain diffusion layer 6 is formed in a region in which the drain diffusion layer 6 is to be formed on the surface of the substrate 1.

In this case, when the TFET is an n-type TFET, arsenic is implanted under ion-implantation conditions of 15 to 30 keV and 1.0 to $4.0 \times 10^{15}$ cm$^{-2}$, for example. On the contrary, when the TFET is a p-type TFET, boron is implanted under ion-implantation conditions of 2.0 to 5.0 keV and 1.0 to $4.0 \times 10^{15}$ cm$^{-2}$, for example. After this ion-implantation, the resist film 25 is removed, and then RTA for activating the impurities implanted in the steps of FIG. 4A and FIG. 4B is performed.

The source diffusion layer 5 in the present embodiment is formed so as to contact the junction forming region 7. More specifically, the source diffusion layer 5 is formed so as to overlap with a portion of the junction forming region 7, so that the source diffusion layer 5 comes into contact with a remaining portion of the junction forming region 7. Also, the drain diffusion layer 6 in the present embodiment is formed so as to be separated from the junction forming region 7.

Figure 4C:
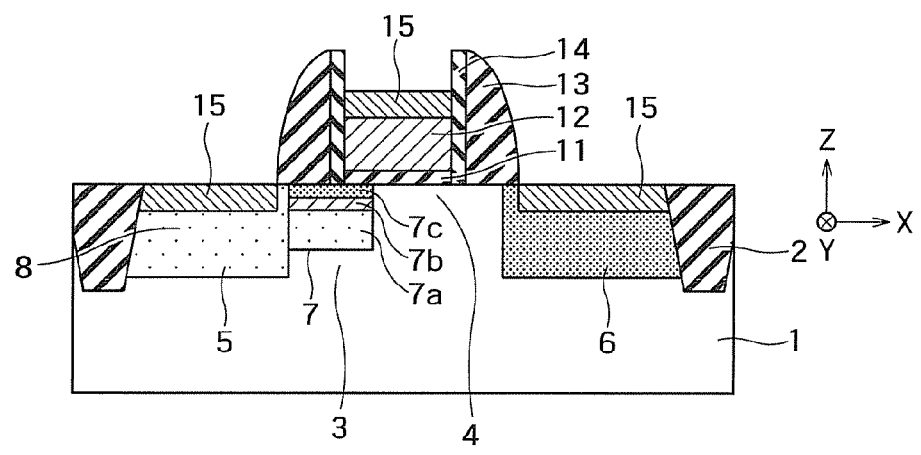

Next, as shown in FIG. 4C, phosphoric acid is used to remove the cap insulator 21. Fluoric acid is then used to remove an unshown natural oxide. As shown in FIG. 4C, the silicide layers 15 are then formed in a self-aligned manner on the surfaces of the source diffusion layer 5, the drain diffusion layer 6, and the gate electrode 12.

The silicide layers 15 are nickel silicide layers formed in the following procedures, for example. First, a nickel layer is formed on the entire surface of the substrate 1 by sputtering. RTA for silicidation is then performed at 400 to 500° C. to form the silicide layers 15. Etching is then performed with use of a mixed solution of sulfuric acid and hydrogen peroxide solution to remove the remaining nickel layer.

In the present embodiment, insulating layers such as a TEOS film, a BPSG film, and a silicon nitride film are deposited on the entire surface of the substrate 1, and chemical mechanical polishing (CMP) is performed for planarization. Furthermore, various components such as inter layer dielectrics, contact plugs, via plugs and interconnects are formed on the substrate 1. In this way, the semiconductor device of FIG. 1 is manufactured.

As described above, the junction forming region 7 in the present embodiment is formed between the source diffusion layer 5 of the first conductivity type and the drain diffusion layer 6 of the second conductivity type so as to contact the source diffusion layer 5. Moreover, the junction forming region 7 in the present embodiment includes the diffusion suppressing layer 7b between the source extension layer 7a of the first conductivity type and the pocket layer 7c of the second conductivity type.

Therefore, according to the present embodiment, it is possible to form the junction forming region 7 which has an abrupt change in impurity concentration between the source extension layer 7a and the pocket layer 7c even after the heating process.

Second Embodiment

1) Structure of Semiconductor Device of Second Embodiment

Figure 5:
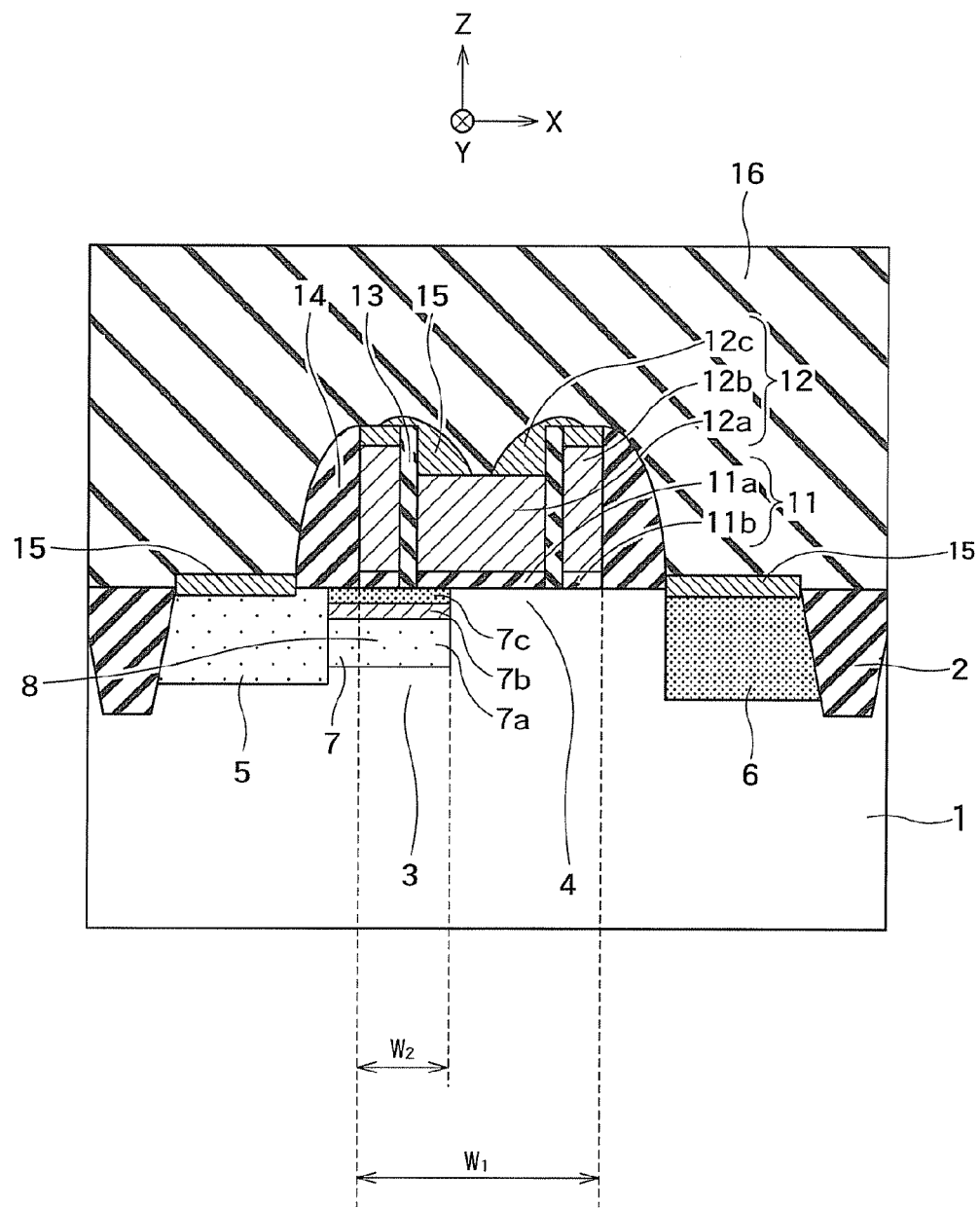
FIG. 5 is a cross sectional view showing a structure of a semiconductor device of a second embodiment.
Figure 6A:
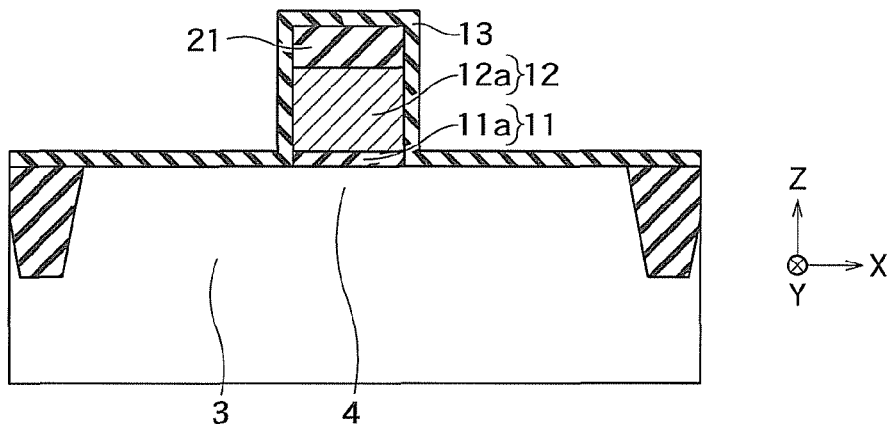
FIGS. 6A to 9B are cross sectional views showing a method of manufacturing the semiconductor device of the second embodiment.
Figure 6B:
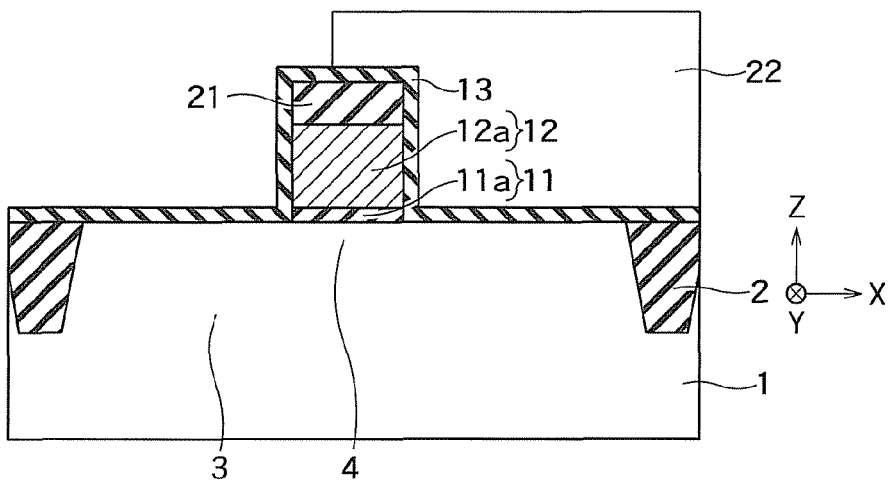
Figure 6C:
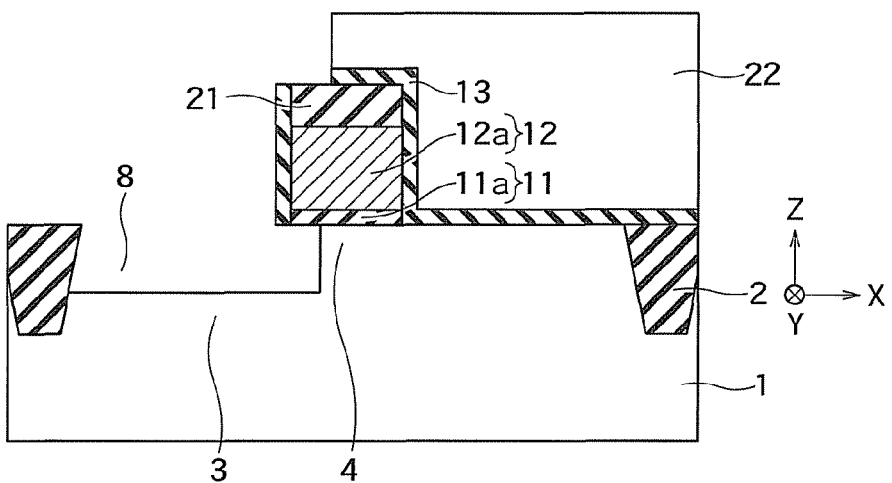

FIG. 5 is a cross sectional view showing a structure of a semiconductor device of a second embodiment.

The gate insulator 11 of the present embodiment includes one first insulator portion 11a formed on the substrate 1, and two second insulator portions 11b formed on the substrate 1 so as to be adjacent to the first insulator portion 11a. The first insulator portion 11a corresponds to the gate insulator 11 of the first embodiment. The first and second insulator portions 11a and 11b are silicon oxide films, for example.

A gate electrode 12 of the present embodiment includes one first electrode portion 12a formed on the first insulator portion 11a, two second electrode portions 12b formed on the second insulator portions 11b, and two third electrode portions 12c formed to connect the first electrode portion 12a to the second electrode portions 12b. The first electrode portion 12a corresponds to the gate electrode 12 of the first embodiment. The first to third electrode portions 12a to 12c are polysilicon layers, for example.

The second electrode portions 12b are formed on both the side surfaces of the first electrode portion 12a via the first sidewall insulators 13. Regarding the second electrode portions 12b, the second electrode portion 12b on the source side is formed on a portion of the channel region 4 where the junction forming region 7 is formed. Contrary, the second electrode portion 12b on the drain side is formed on another portion of the channel region 4 where the junction forming region 7 is not present. The second sidewall insulators 14 are formed on both the side surfaces of the first electrode portion 12a via the first sidewall insulators 13 and the second electrode portions 12b.

According to the present embodiment, it is possible to lengthen the width "W$_2$" and to expand the region in which the upper surface of the junction forming region 7 faces the lower surface of the gate electrode 12. Therefore, according to the present embodiment, it is possible to expand the region in which a tunnel current (driving current) flows and to provide a large tunnel current between the source extension layer 7a and the pocket layer 7c. Moreover, it is not necessary in the present embodiment to widely etch the trench 8 on the surface of the substrate 1 in a horizontal direction for obtaining a large area of the junction forming region 7. Consequently, according to the present embodiment, it is possible to reduce the possibility that the junction forming region 7 formed by epitaxial growth is short-circuited to the gate electrode 12.

2) Method of Manufacturing Semiconductor Device of Second Embodiment

FIGS. 6A to 9B are cross sectional views showing a method of manufacturing the semiconductor device of the second embodiment.

First, steps of FIGS. 6A to 7B are performed in the same manner as the steps of FIGS. 2A to 3B, respectively. However, when the steps of FIGS. 2A to 3B are replaced with the steps of FIGS. 6A to 7B, the gate insulator 11 and the gate electrode 12 are to be read as the first insulator portion 11a and the first electrode portion 12a, respectively.

Figure 7A:
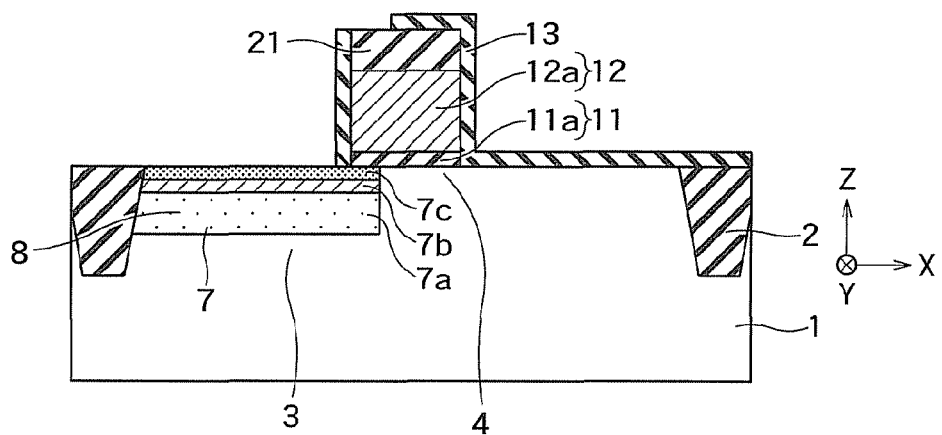
Figure 7B:
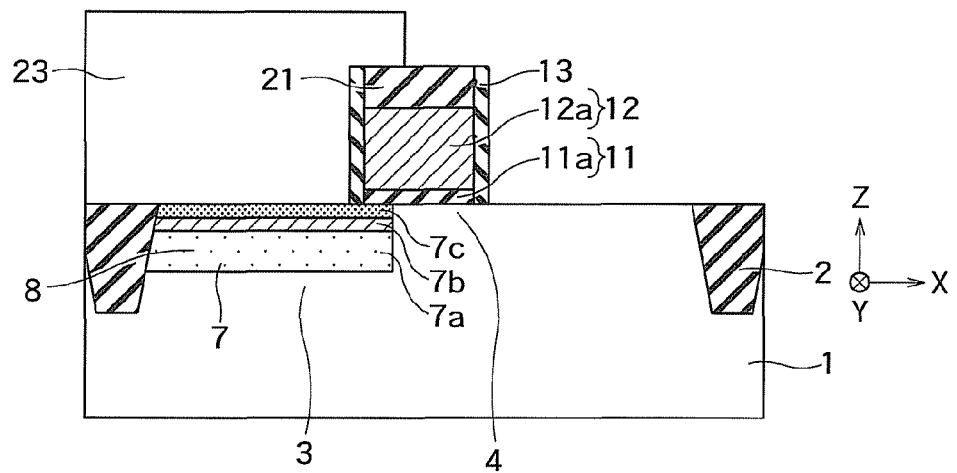
Figure 7C:
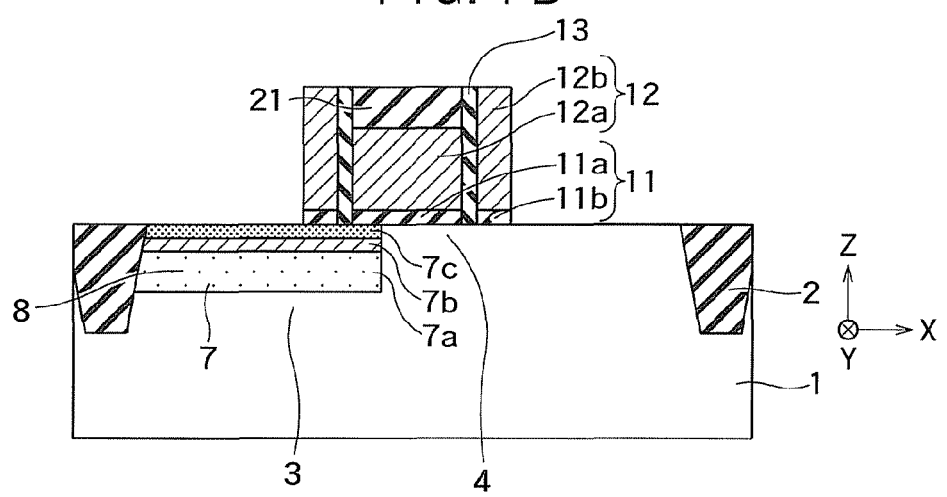

Next, an insulating material for forming the second insulator portions 11b is formed on the surfaces of the substrate 1 and the junction forming region 7 by thermal oxidation (FIG. 7C). A thickness of the insulating material is 0.5 to 6.0 nm, for example. The insulating material may be formed by LPCVD, for example. In this case, the insulating material is formed on the entire surface of the substrate 1.

Next, an electrode material for forming the second electrode portions 12b is deposited on the entire surface of the substrate 1. Pre-doping is then applied to the electrode material (FIG. 7C). A thickness of the electrode material is 50 to 150 nm, for example.

Next, the electrode material is etched by RIE. As a result, the second electrode portions 12b are formed on the substrate 1 via the second insulator portions 11b (FIG. 7C).

Figure 8A:
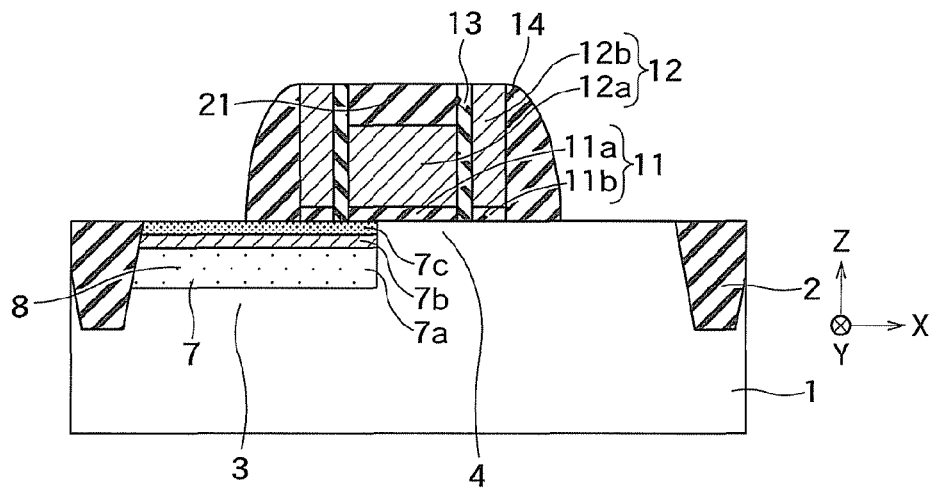

Next, as shown in FIG. 8A, the second sidewall insulators 14 are formed on the second electrode portions 12b. The second sidewall insulators 14 are formed, for example, by depositing an insulating material for forming the second sidewall insulators 14 on the entire surface of the substrate 1 and etching the insulating material by RIE.

Figure 8B:
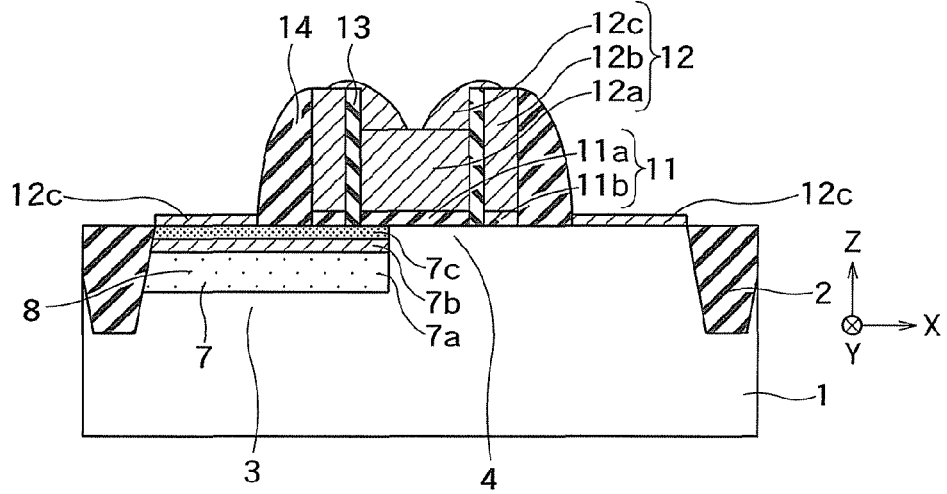
Figure 8C:
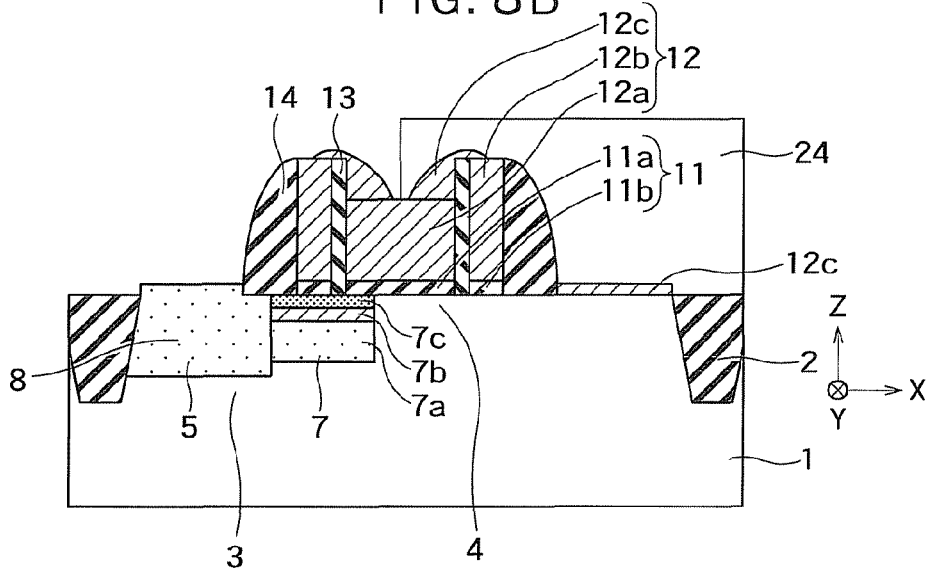

Next, as shown in FIG. 8B, phosphoric acid is used to remove the cap insulator 21. As shown in FIG. 8B, the third electrode portions 12c are formed on the first and second electrode portions 12a and 12b by epitaxial growth. As a result, the first electrode portion 12a is short-circuited to the second electrode portions 12b, so that a gate voltage can be applied to both the first and second electrode portions 12a and 12b. In the epitaxial growth step of FIG. 8B, epitaxial semiconductor layers for forming the third electrode portions 12c are also formed on the surfaces of the substrate 1 and the junction forming region 7.

Figure 9A:
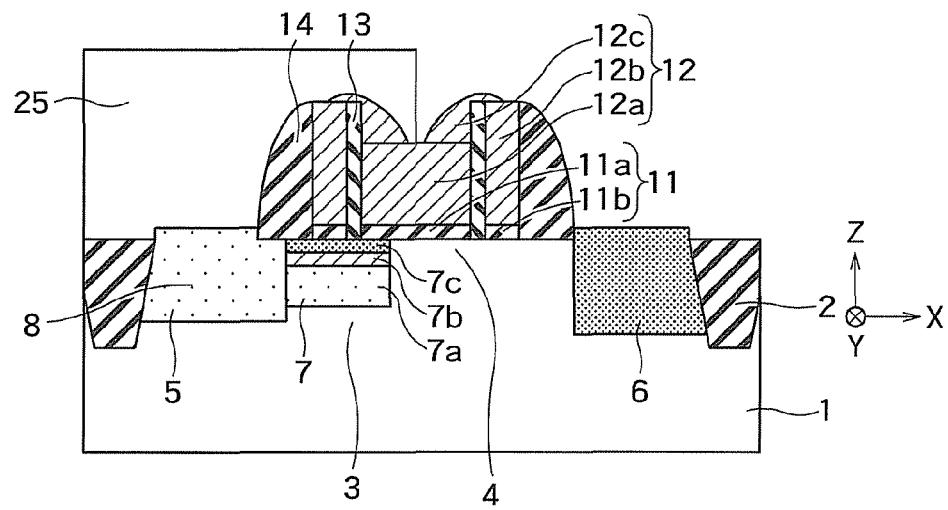
Figure 9B:
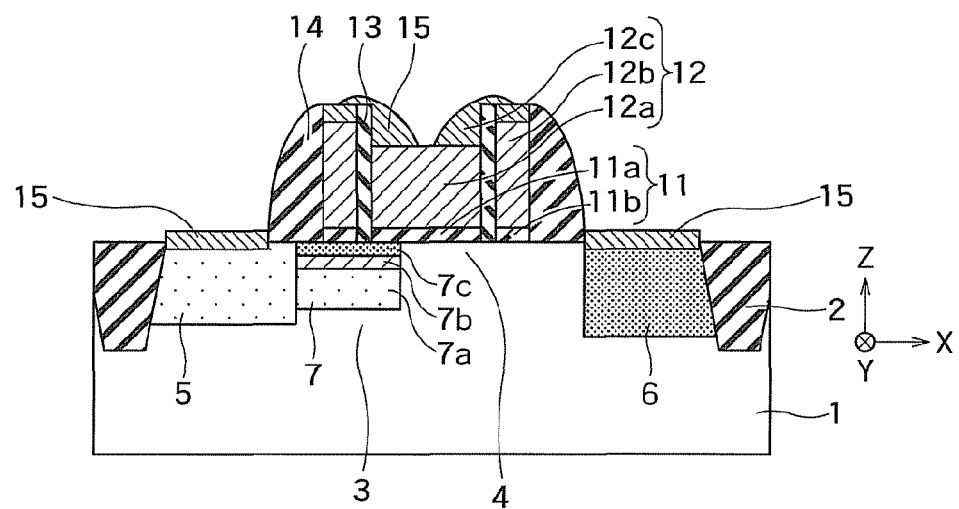

Next, steps of FIGS. 8C to 9B are performed in the same manner as the steps of FIGS. 4A to 4C, respectively. FIG. 9B shows the silicide layers 15 formed on the surfaces of the source diffusion layer 5, the drain diffusion layer 6, and the gate electrode 12.

In the present embodiment, various components such as inter layer dielectrics, contact plugs, via plugs and interconnects are then formed on the substrate 1. In this way, the semiconductor device of FIG. 5 is manufactured.

As described above, the gate electrode 12 in the present embodiment is formed of the first to third electrode portions 12a to 12c, so that the area of the region in which the upper surface of the junction forming region 7 faces the lower surface of the gate electrode 12 can be expanded. Therefore, according to the present embodiment, a larger tunnel current can be provided between the source extension layer 7a and the pocket layer 7c.

Third Embodiment

1) Structure of Semiconductor Device of Third Embodiment

Figure 10:
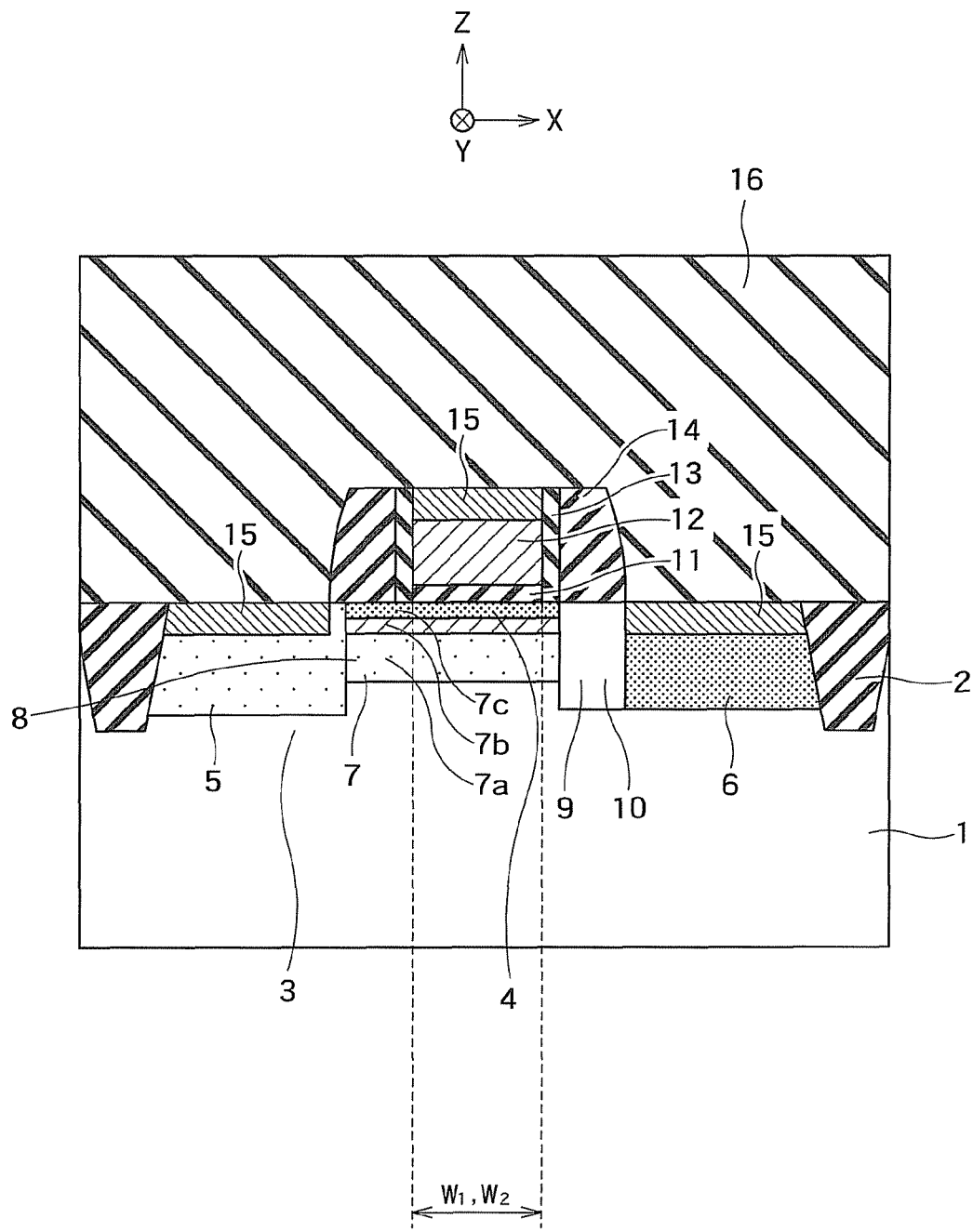
FIG. 10 is a cross sectional view showing a structure of a semiconductor device of a third embodiment.

FIG. 10 is a cross sectional view showing a structure of a semiconductor device of a third embodiment.

In the first embodiment, the X-directional width "$W_2$" of the region where the upper surface of the junction forming region 7 faces the lower surface of the gate electrode 12 is set to less than half the X-directional width "$W_1$" of the lower surface of the gate electrode 12 ($W_2 < W_1/2$). In the third embodiment, the width "$W_2$" is set to half the width "$W_1$" or more ($W_2 \geq W_1/2$). More specifically, in the third embodiment, the entire lower surface of the gate electrode 12 faces the upper surface of the junction forming region 7, so that the width "$W_2$" coincides with the width "$W_1$" ($W_2 = W_1$).

According to the present embodiment, it is possible to expand the region in which the upper surface of the junction forming region 7 faces the lower surface of the gate electrode 12, similarly to the second embodiment. Therefore, according to the present embodiment, it is possible to expand the region in which a tunnel current (driving current) flows and to provide a large tunnel current between the source extension layer 7a and the pocket layer 7c, similarly to the second embodiment.

In FIG. 10, a trench 10 is formed on a drain-side surface of the substrate 1, and a semiconductor layer 9 is formed in the trench 10. In addition, the drain diffusion layer 6 is formed on the surface of the substrate 1. More specifically, the drain diffusion layer 6 is formed only in a part of the semiconductor layer 9 on the surface of the substrate 1. The junction forming region 7 is in contact with the semiconductor layer 9, but is separated from the drain diffusion layer 6. A method of forming such a junction forming region 7, a semiconductor layer 9, and a trench 10 will be described later in detail.

2) Method of Manufacturing Semiconductor Device of Third Embodiment

FIGS. 11A to 13C are cross sectional views showing a method of manufacturing the semiconductor device of the third embodiment. A description of the steps common to those of the first embodiment will be omitted in part.

Figure 11A:
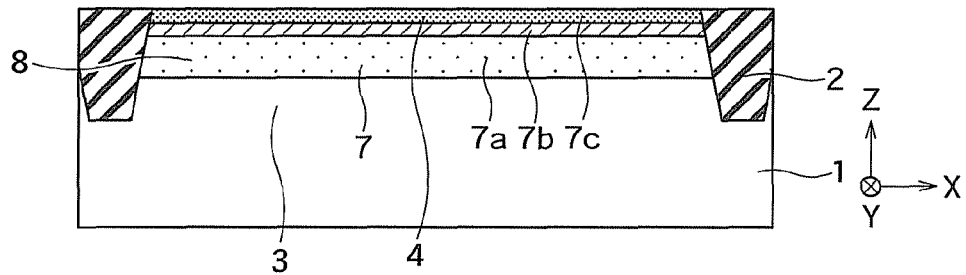
FIGS. 11A to 13C are cross sectional views showing a method of manufacturing the semiconductor device of the third embodiment.

First, as shown in FIG. 11A, the isolation insulators 2 are formed on the surface of the substrate 1. As shown in FIG. 11A, the well region 3 and the channel region 4 are then formed in the substrate 1.

Next, as shown in FIG. 11A, the entire surface of the substrate 1 between the isolation insulators 2 is etched to form the trench 8 on the surface of the substrate 1. As shown in FIG. 11A, the source extension layer 7a, the diffusion suppressing layer 7b, and the pocket layer 7c are sequentially formed in the trench 8 by epitaxial growth. As a result, the junction forming region 7 is formed in the trench 8. One of the source extension layer 7a and the pocket layer 7c is a silicon layer doped with boron, for example. The other is a silicon layer doped with phosphorus, for example. The diffusion suppressing layer 7b is an Si:C layer, for example.

Figure 11B:
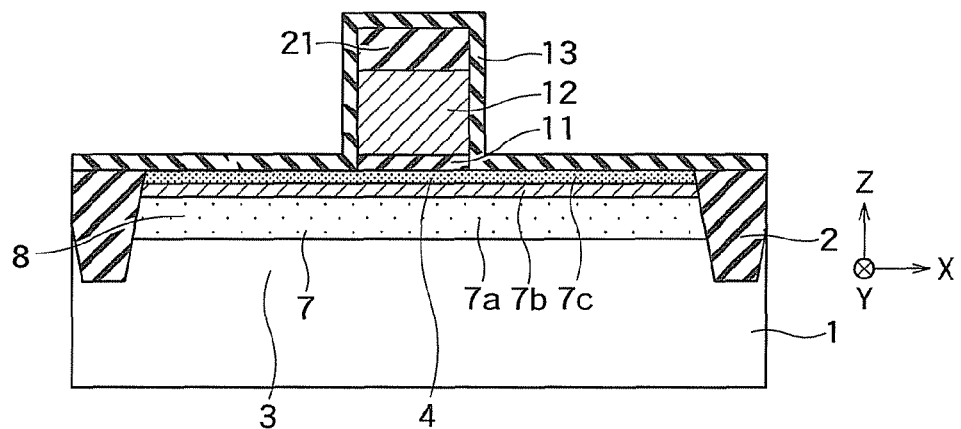

Next, an insulating material for forming the gate insulator 11 is formed on the substrate 1 via the junction forming region 7 (FIG. 11B). An electrode material for forming the gate electrode 12 is then deposited on the insulating material (FIG. 11B). The cap insulator 21 is then deposited on the electrode material (FIG. 11B). Next, a resist mask for gate processing is formed by lithography, and then the cap insulator 21 and the electrode material are etched by RIE. As a result, the gate electrode 12 is formed on the junction forming region 7 on the substrate 1 via the gate insulator 11 (FIG. 11B). As shown in FIG. 11B, an insulating material for forming the first sidewall insulators 13 (hereinafter, referred to as an insulating material 13) is formed on the entire surface of the substrate 1.

Figure 11C:
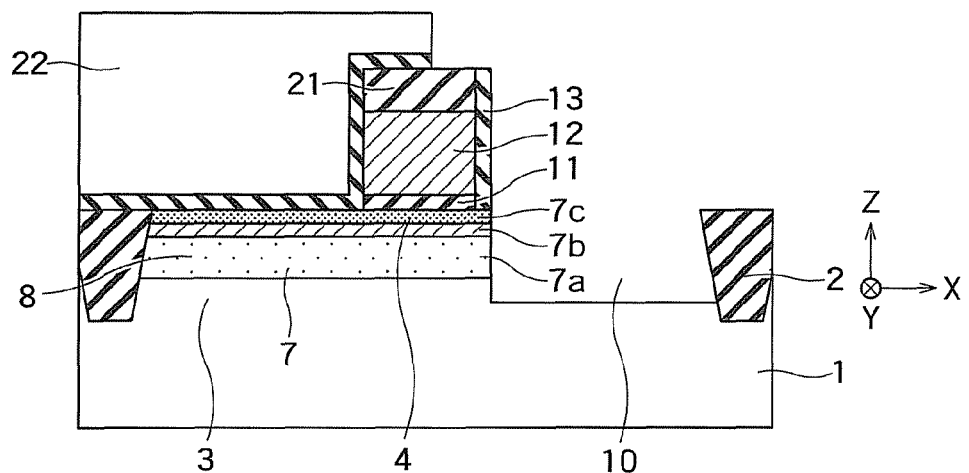

Next, as shown in FIG. 11C, the source side of the substrate 1 is coated with the resist film 22. As shown in FIG. 11C, etching is then performed using the resist film 22 as a mask to remove the insulating material 13 on the upper surfaces of the junction forming region 7 and the cap insulator 21 on the drain side, and to etch the junction forming region 7 to form the trench 10 on the surface of the substrate 1. The resist film 22 is then removed.

In the present embodiment, the trench 10 is formed by anisotropic etching. Accordingly, the trench 10 is formed only between the isolation insulator 2 and the gate electrode 12 without substantially extending under the gate electrode 12. As a result, the length of the width "$W_2$" in the present embodiment becomes equal to the length of the width "$W_1$" ($W_2 = W_1$) as shown in FIG. 10.

The trench 10 may be formed by isotropic etching. In this case, the trench 10 is formed so as to extend not only between the isolation insulator 2 and the gate electrode 12 but also extend under the gate electrode 12. As a result, the length of the width "$W_2$" becomes shorter than the length of the width "$W_1$" ($W_2 < W_1$).

Figure 12A:
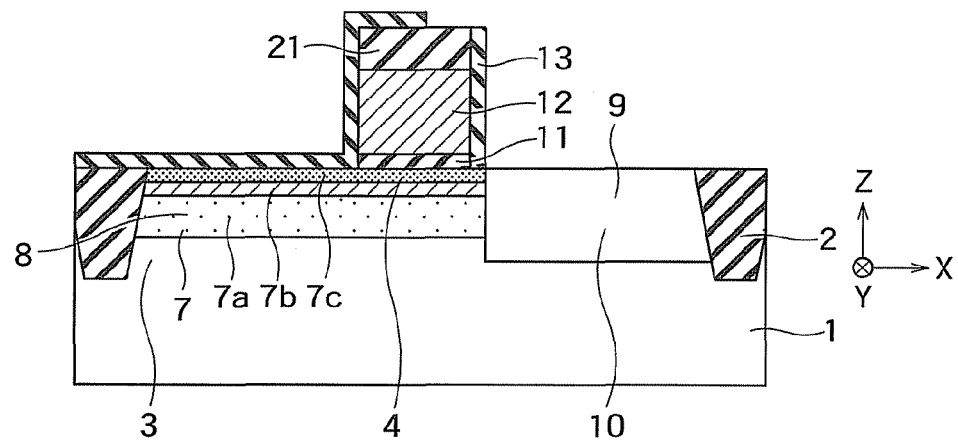

Next, as shown in FIG. 12A, the semiconductor layer 9 is formed in the trench 10 by epitaxial growth using the insulating material 13 and the cap insulator 21 as a mask. The semiconductor layer 9 is an intrinsic-type (i-type) silicon layer, for example. In the present embodiment, a height of the upper surface of the semiconductor layer 9 coincides with a height of the upper surface of the substrate 1. However, the height of the upper surface of the semiconductor layer 9 may be higher than the upper surface of the substrate 1.

Figure 12B:
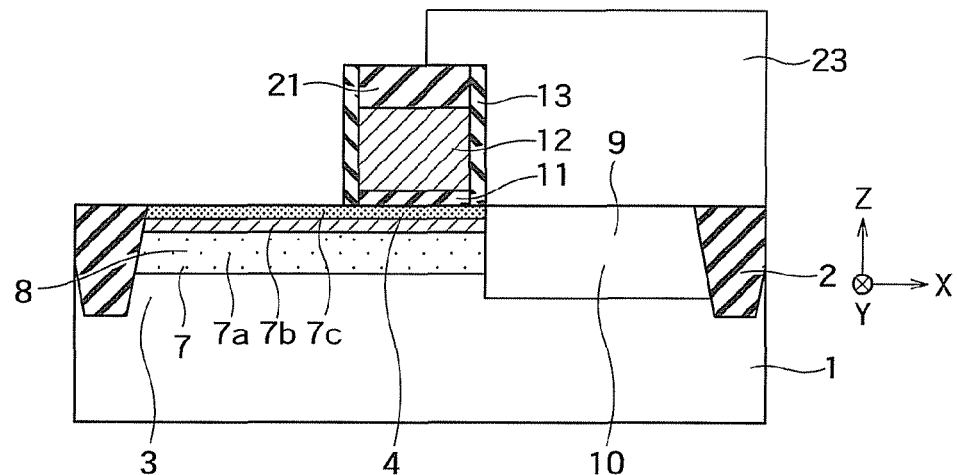

Next, as shown in FIG. 12B, the drain side of the substrate 1 is coated with the resist film 23. As shown in FIG. 12B, etching is then performed using the resist film 23 as a mask to remove the insulating material 13 on the upper surfaces of the junction forming region 7 and the cap insulator 21 on the source side. As a result, the first sidewall insulators 13 are formed on side surfaces of the gate electrode 12 and the cap insulator 21. The resist film 23 is then removed.

Figure 12C:
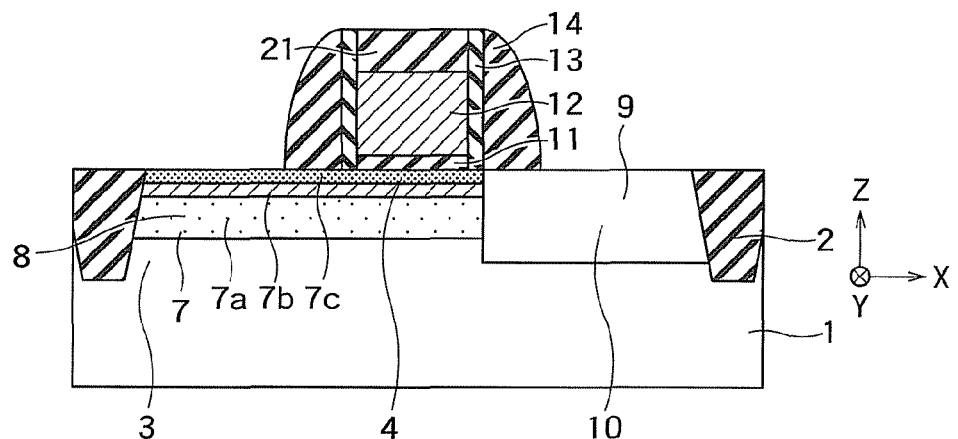

Next, as shown in FIG. 12C, the second sidewall insulators 14 are formed on the side surfaces of the gate electrode 12 and the cap insulator 21 via the first sidewall insulators 13. The second sidewall insulators 14 are formed, for example, by depositing an insulating material for forming the second sidewall insulators 14 on the entire surface of the substrate 1 and etching the insulating material by RIE.

Figure 13A:
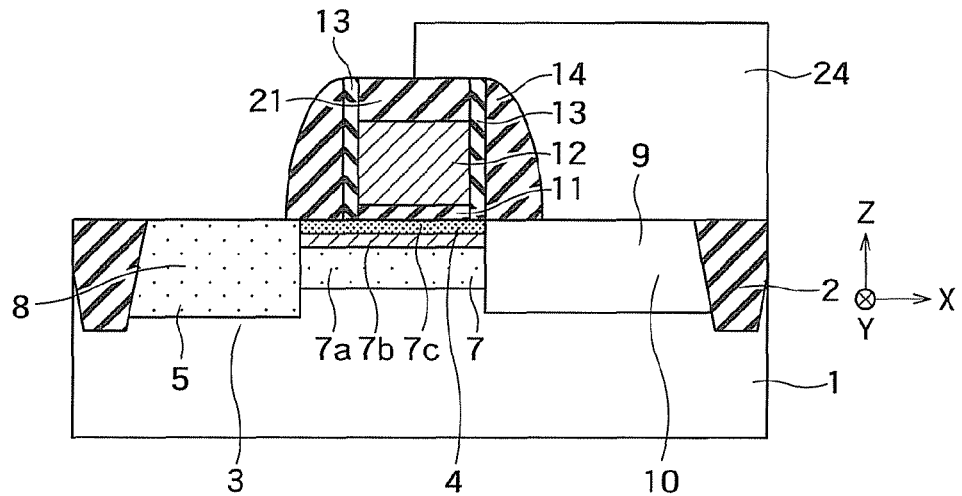

Next, as shown in FIG. 13A, the drain side of the substrate 1 is coated with the resist film 24. As shown in FIG. 13A, by ion implantation using the resist film 24 as a mask, a heavily doped impurity region to be the source diffusion layer 5 is formed on the surface of the substrate 1. The resist film 24 is then removed.

Figure 13B:
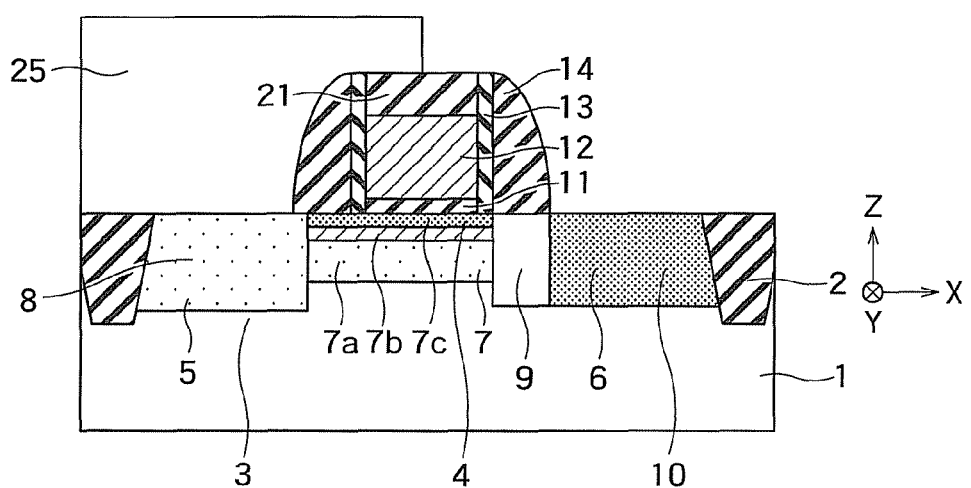

Next, as shown in FIG. 13B, the source side of the substrate 1 is coated with the resist film 25. As shown in FIG. 13B, by ion implantation using the resist film 25 as a mask, a heavily doped impurity region to be the drain diffusion layer 6 is formed on the surface of the substrate 1. In the present embodiment, after the ion-implantation, the resist film 25 is removed, and then RTA for activating the impurities implanted in the steps of FIG. 13A and FIG. 13B is performed.

As shown in FIG. 13B, the drain diffusion layer 6 of the present embodiment is formed in the semiconductor layer 9 on the surface of the substrate 1 so as to be separated from the junction forming region 7.

Figure 13C:
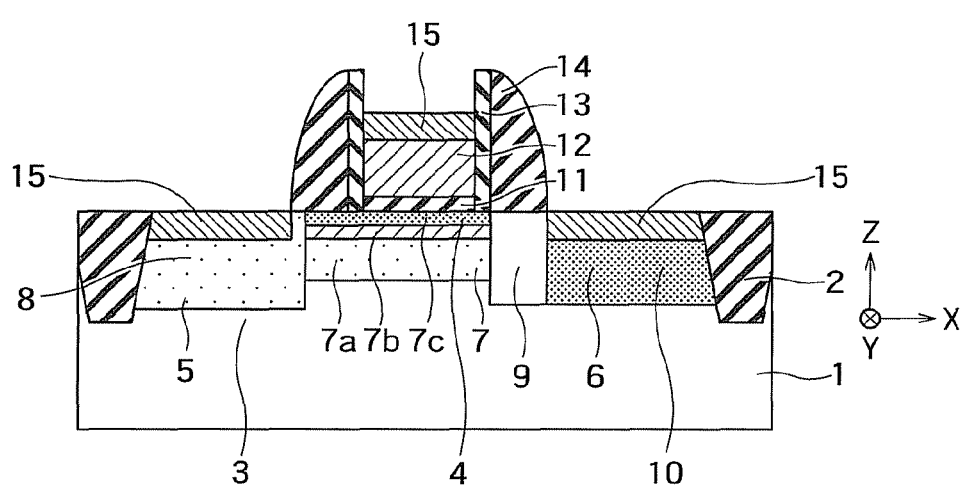

Next, as shown in FIG. 13C, phosphoric acid is used to remove the cap insulator 21. As shown in FIG. 13C, the silicide layers 15 are then formed in a self-aligned manner on the surfaces of the source diffusion layer 5, the drain diffusion layer 6, and the gate electrode 12.

In the present embodiment, insulating layers such as a TEOS film, a BPSG film, and a silicon nitride film is then deposited on the entire surface of the substrate 1, and CMP is performed for planarization. Furthermore, various components such as inter layer dielectrics, contact plugs, via plugs and interconnects are formed on the substrate 1. In this way, the semiconductor device of FIG. 10 is manufactured.

As described above, according to the present embodiment, the width "$W_2$" is set to half of the width "$W_1$" or more, so that the region in which the upper surface of the junction forming region 7 faces the lower surface of the gate electrode 12 can be expanded. Therefore, according to the present embodiment, a larger tunnel current can be provided between the source extension layer 7a and the pocket layer 7c. The structure of the third embodiment may be applied in combination of the structure of the second embodiment.

Fourth Embodiment

Figure 14:
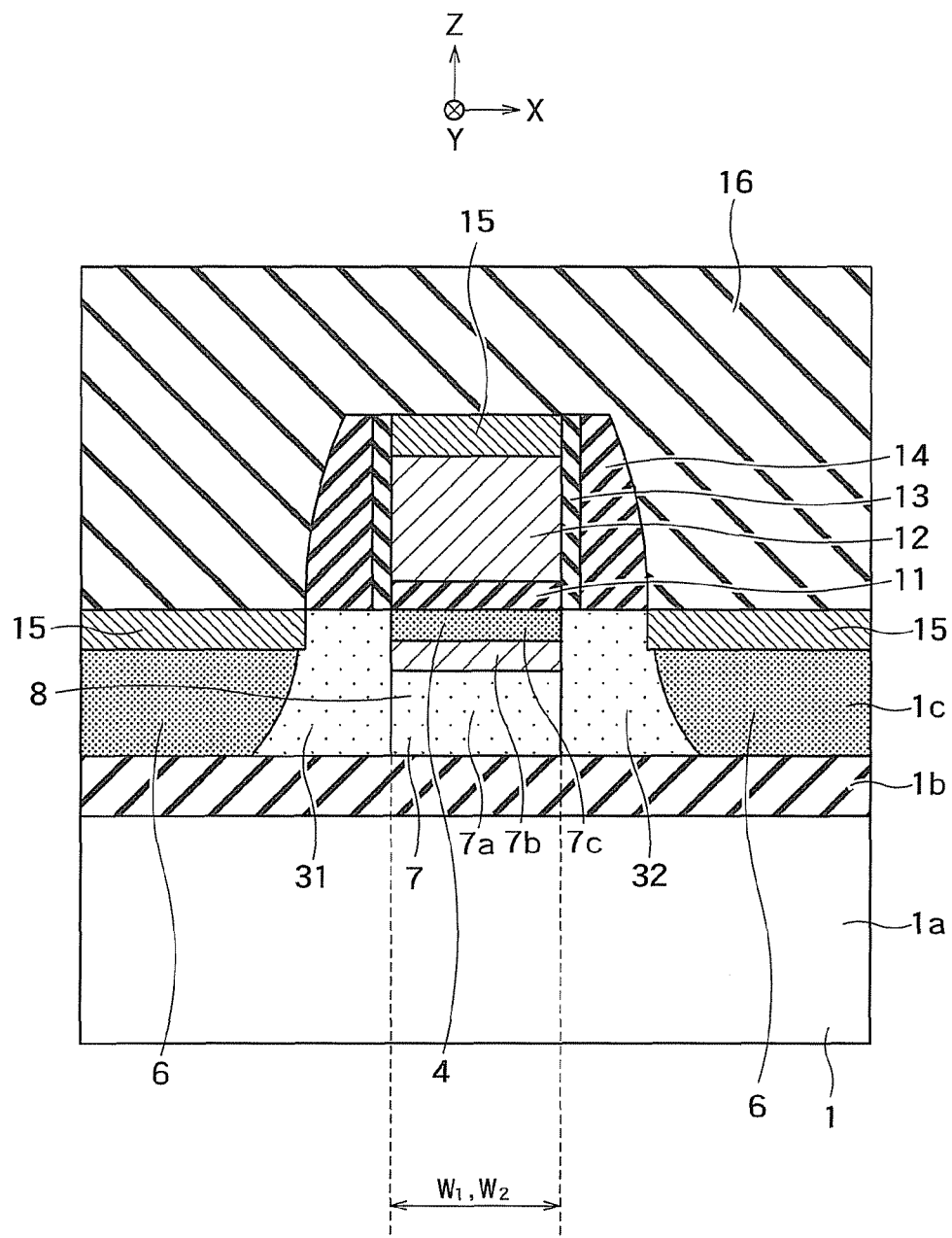
FIG. 14 is a cross sectional view showing a structure of a semiconductor device of a fourth embodiment.

FIG. 14 is a cross sectional view showing a structure of a semiconductor device of a fourth embodiment. The semiconductor device of the present embodiment includes a FET having a structure different from those of the first to third embodiments.

The substrate 1 of the present embodiment is a semiconductor on insulator (SOI) substrate which includes a semiconductor substrate 1a, a buried insulator 1b formed on the semiconductor substrate 1a, and a semiconductor layer 1c formed on the buried insulator 1b. The semiconductor substrate 1a, the buried insulator 1b, and the semiconductor layer 1c are respectively a silicon substrate, a silicon oxide layer, and a silicon layer, for example.

In the present embodiment, a region under the gate electrode 12 is a source region, and regions in the lateral directions of the gate electrode 12 are drain regions. Therefore, in the present embodiment, two drain diffusion layers 6 are formed in the semiconductor layer 1c so as to sandwich the gate electrode 12. The junction forming region 7 in the present embodiment is formed between the drain diffusion layers 6 in the semiconductor layer is under the gate electrode 12. The junction forming region 7 includes, in order from the lower side to the upper side, the source extension layer 7a, the diffusion suppressing layer 7b, and the pocket layer 7c.

Although the source diffusion layer 5 is not shown in FIG. 14, the source diffusion layer 5 is formed in the semiconductor layer 1c in the Y-direction of the junction forming region 7 so as to contact the junction forming region 7. The source diffusion layer 5 of the present embodiment is in contact with a side surface of the junction forming region 7 in the Y-direction, as similar to the source diffusion layer 5 of the first embodiment which is in contact with a side surface of the junction forming region 7 in the X-direction. The source diffusion layer 5 of the present embodiment extends to a region where the gate electrode 12 is not formed on its upper portion. In this region, a contact plug is formed on the source diffusion layer 5.

In the present embodiment, the entire lower surface of the gate electrode 12 faces the upper surface of the junction forming region 7, so that the width "$W_2$" coincides with the width "$W_1$" ($W_2=W_1$).

In the present embodiment, when the TFET is an n-type TFET, the source diffusion layer 5 and the source extension layer 7a are p-type layers, while the drain diffusion layers 6 are n-type layers. In addition, the pocket layer 7c is an n-type layer, and the diffusion suppressing layer 7b is an Si:C layer for example. First and second semiconductor regions 31 and 32 formed between the junction forming region 7 and the drain diffusion layers 6 may be are p-type layers, or may be i-type layers.

In the present embodiment, the diffusion suppressing layer 7b is formed between the source extension layer 7a and the pocket layer 7c which are different in conductivity type, similarly to the first to third embodiments. Therefore, according to the present embodiment, it is possible to form the junction forming region 7 which has an abrupt change in impurity concentration between the source extension layer 7a and the pocket layer 7c even after the heating process, similarly to the first to third embodiments.

In this manner, according to the present embodiment, the junction forming region 7 having an abrupt change in impurity concentration can also be applied to the FET which is different in structure from the TFETs of the first to third embodiments, for example, can be applied to such an FET shown in FIG. 14, The semiconductor device of the present embodiment can be manufactured, for example, by forming components such as the junction forming region 7, the trench 8, the gate insulator 11 and the gate electrode 12 by the method similar to that of the third embodiment, and changing positions of forming the source diffusion layer 5 and the drain diffusion layer 6 to those of the present embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a gate insulator disposed on the substrate;
   a gate electrode disposed on the gate insulator;
   a source diffusion layer of a first conductivity type and a drain diffusion layer of a second conductivity type which are disposed on a surface of the substrate so as to sandwich the gate electrode, the second conductivity type being an opposite conductivity type to the first conductivity type; and
   a junction forming region disposed between the source diffusion layer and the drain diffusion layer so as to contact the source diffusion layer, and having a surface facing the gate insulator,
   wherein the junction forming region comprises:
   a source extension layer of the first conductivity type;
   a pocket layer of the second conductivity type disposed above the source extension layer; and
   a carbon containing layer disposed between the source extension layer and the pocket layer,
   a carbon concentration on the surface of the junction forming region being lower than a carbon concentration in the carbon containing layer.

2. The device of claim 1, wherein a ratio of a number of carbon atoms to a number of silicon atoms and the carbon atoms in the carbon containing layer is 0.3 to 3.0 Atomic %.

3. The device of claim 1, wherein the source extension layer, the pocket layer and the carbon containing layer are semiconductor layers disposed in a trench provided on the surface of the substrate.

4. The device of claim 1, wherein
   the gate insulator comprises a first insulator portion disposed on the substrate, and a second insulator portion disposed on the substrate so as to be adjacent to the first insulator portion, and
   the gate electrode comprises a first electrode portion disposed on the first insulator portion, a second electrode portion disposed on the second insulator portion, and a third electrode portion disposed to connect the first electrode portion to the second electrode portion.

5. The device of claim 1, wherein a region in which an upper surface of the junction forming region faces a lower surface of the gate electrode has a gate-length directional width which is half or more of a gate-length directional width of the lower surface of the gate electrode.

6. The device of claim 1, wherein the drain diffusion layer is disposed in a semiconductor layer provided in a trench on the surface of the substrate.

7. The device of claim 1, wherein the carbon containing layer further contains germanium.

8. The device of claim 7, wherein a ratio of a number of germanium atoms to a number of silicon atoms and the germanium atoms in the carbon containing layer is 5.0 Atomic % or more.

9. A semiconductor device comprising:
   a substrate;
   a gate insulator disposed on the substrate;
   a gate electrode disposed on the gate insulator;
   a first drain diffusion layer of a first conductivity type and a second drain diffusion layer of the first conductivity type which are disposed on a surface of the substrate so as to sandwich the gate electrode;
   a junction forming region disposed between the first drain diffusion layer and the second drain diffusion layer, and having a surface facing the gate insulator; and
   a source diffusion layer of a second conductivity type disposed to contact the junction forming region, the second conductivity type being an opposite conductivity type to the first conductivity type,
   wherein the junction forming region comprises:
   a source extension layer of the second conductivity type;
   a pocket layer of the first conductivity type disposed above the source extension layer; and
   a carbon containing layer disposed between the source extension layer and the pocket layer,
   a carbon concentration on the surface of the junction forming region being lower than a carbon concentration in the carbon containing layer.

10. The device of claim 9, wherein a ratio of a number of carbon atoms to a number of silicon atoms and the carbon atoms in the carbon containing layer is 0.3 to 3.0 Atomic %.

11. The device of claim 9, wherein the substrate comprises a semiconductor substrate, an insulating layer on the semiconductor substrate, and a semiconductor layer on the insulating layer.

12. The device of claim 9, wherein further comprising:
    a first semiconductor region of the second conductivity type or an intrinsic type disposed between the first drain diffusion layer and the junction forming region; and
    a second semiconductor region of the second conductivity type or the intrinsic type disposed between the second drain diffusion layer and the junction forming region.

13. The device of claim 9, wherein the carbon containing layer further contains germanium.

14. The device of claim 13, wherein a ratio of a number of germanium atoms to a number of silicon atoms and the germanium atoms in the carbon containing layer is 5.0 Atomic % or more.

15. A method of manufacturing a semiconductor device, comprising:
    forming a trench on a surface of a substrate;
    forming a junction forming region by sequentially forming, in the trench, a source extension layer of a first conductivity type, a diffusion suppressing layer containing carbon so as to suppress diffusion of impurities, and a pocket layer of a second conductivity type which is an opposite conductivity type to the first conductivity type; and
    forming a source diffusion layer of the first conductivity type on the surface of the substrate so as to contact the junction forming region.

16. The method of claim 15, wherein a ratio of a number of carbon atoms to a number of silicon atoms and the carbon atoms in the diffusion suppressing layer is 0.3 to 3.0 Atomic %.

17. The method of claim 15, wherein a bottom surface and a side surface of the trench is a (100) plane and a (110) plane, respectively.

18. The method of claim 15, wherein the source extension layer, the diffusion suppressing layer and the pocket layer are formed in the trench by epitaxial growth.

19. The method of claim 15, wherein the diffusion suppressing layer further contains germanium.

20. The method of claim 19, wherein a ratio of a number of germanium atoms to a number of silicon atoms and the germanium atoms in the diffusion suppressing layer is 5.0 Atomic % or more.

* * * * *